(12) United States Patent
Apitz et al.

(10) Patent No.: US 11,079,514 B2
(45) Date of Patent: Aug. 3, 2021

(54) OPTICAL ELEMENT WITH HIGH SCRATCH RESISTANCE

(71) Applicant: SCHOTT AG, Mainz (DE)

(72) Inventors: Dirk Apitz, Lousanne (CH); Marten Walther, Alfeld (DE); Christian Henn, Frei-Laubersheim (DE)

(73) Assignee: SCHOTT AG, Mainz (DE)

( * ) Notice: Subject to any disclaimer, the term of this patent is extended or adjusted under 35 U.S.C. 154(b) by 115 days.

(21) Appl. No.: 16/212,197

(22) Filed: Dec. 6, 2018

(65) Prior Publication Data

US 2019/0113657 A1     Apr. 18, 2019

Related U.S. Application Data

(63) Continuation of application No. 14/732,327, filed on Jun. 5, 2015, now abandoned.

(30) Foreign Application Priority Data

Jun. 6, 2014   (DE) .......................... 102014108058.0

(51) Int. Cl.
| G02B 1/11 | (2015.01) |
| C23C 14/34 | (2006.01) |
| G02B 1/115 | (2015.01) |
| G02B 1/14 | (2015.01) |

(Continued)

(52) U.S. Cl.
CPC ............ *G02B 1/11* (2013.01); *C23C 14/0036* (2013.01); *C23C 14/3414* (2013.01); *C23C 14/46* (2013.01); *G02B 1/115* (2013.01); *G02B 1/14* (2015.01)

(58) Field of Classification Search
CPC .......... B29D 11/00865; C23C 14/0036; C23C 14/3414; C23C 14/46; G02B 1/11; G02B 1/115; G02B 1/14
See application file for complete search history.

(56) References Cited

U.S. PATENT DOCUMENTS

| 5,871,843 A | 2/1999 | Yoneda |
| 6,068,914 A | 5/2000 | Boire |
| 6,175,450 B1 | 1/2001 | Andreani |
| (Continued) | | |

FOREIGN PATENT DOCUMENTS

| DE | 3941796 | 6/1991 |
| DE | 69730259 | 9/2005 |
| (Continued) | | |

*Primary Examiner* — Cara E Rakowski
(74) *Attorney, Agent, or Firm* — Ohlandt, Greeley, Ruggiero & Perle, L.L.P.

(57) ABSTRACT

An optical element is provided that includes a substrate that is transparent in the visible spectral region and a multilayer anti-reflection coating on the substrate. The coating has alternating layers of layers having a first refractive index and of layers having a second, higher refractive index. The layers having the higher refractive index contain nitride or oxynitride and the layers having the first refractive index contain oxide of silicon and of at least one other element. The molar fraction of silicon in the layers having the first refractive index is predominant when compared to the molar fraction (s) of the other element or elements. The uppermost layer of the coating is a layer having the first refractive index. A layer of chain-form organofluoro molecules is disposed on the coating, wherein the molecules are bonded at the ends to the surface of the optical element.

23 Claims, 5 Drawing Sheets

(51) Int. Cl.
*C23C 14/00* (2006.01)
*C23C 14/46* (2006.01)

(56) References Cited

U.S. PATENT DOCUMENTS

| | | |
|---|---|---|
| 6,924,037 B1 | 8/2005 | Joret |
| 8,460,804 B2 | 6/2013 | Henn |
| 9,296,648 B2 | 3/2016 | Henn |
| 2001/0031365 A1 | 10/2001 | Anderson |
| 2002/0001724 A1 | 1/2002 | Anderson |
| 2002/0017452 A1 | 2/2002 | Zimmermann |
| 2002/0192473 A1 | 12/2002 | Gentilhomme |
| 2003/0039843 A1 | 2/2003 | Johnson |
| 2004/0089535 A1 | 5/2004 | Wolfe |
| 2005/0074591 A1 | 4/2005 | Zagdoun |
| 2006/0124449 A1 | 6/2006 | Hartig |
| 2006/0165963 A1 | 7/2006 | Fleury |
| 2007/0148064 A1 | 6/2007 | Labrousse |
| 2007/0188871 A1 | 8/2007 | Fleury |
| 2008/0226882 A1 | 9/2008 | Belliot |
| 2008/0241523 A1 | 10/2008 | Huignard |
| 2009/0032191 A1 | 2/2009 | Chistyakov |
| 2009/0104385 A1 | 4/2009 | Reymond |
| 2009/0148688 A1 | 6/2009 | Sasaki |
| 2009/0173622 A1 | 7/2009 | Weichart |
| 2009/0197048 A1 | 8/2009 | Amin |
| 2009/0233077 A1 | 9/2009 | Advincula |
| 2009/0244709 A1 | 10/2009 | Suzuki |
| 2010/0000591 A1 | 1/2010 | Anderson |
| 2010/0006426 A1 | 1/2010 | Sittinger |
| 2010/0027383 A1 | 2/2010 | Suzuki |
| 2010/0031365 A1 | 2/2010 | Krishnamurthy |
| 2010/0039708 A1 | 2/2010 | Suzuki |
| 2010/0313875 A1 | 12/2010 | Kennedy |
| 2011/0017272 A1 | 1/2011 | Anderson |
| 2012/0080832 A1 | 4/2012 | Woodard |
| 2012/0164051 A1 | 6/2012 | Bruns |
| 2012/0212826 A1 | 8/2012 | Henn |
| 2012/0321898 A1 | 12/2012 | Meinhardt |
| 2013/0260115 A1 | 10/2013 | Suzuki |

FOREIGN PATENT DOCUMENTS

| | | |
|---|---|---|
| DE | 60220066 | 1/2008 |
| DE | 102006046312 | 4/2008 |
| DE | 102007033338 | 6/2010 |
| EP | 1148037 | 10/2001 |
| EP | 1297362 | 4/2003 |
| EP | 2149540 | 2/2010 |
| EP | 2492251 | 8/2012 |
| FR | 2841894 | 1/2004 |
| FR | 2861386 | 4/2005 |
| FR | 2889182 | 2/2007 |
| FR | 2898295 | 9/2007 |
| JP | 2002006103 | 1/2002 |
| JP | 2003536097 | 12/2003 |
| JP | 2004093437 | 3/2004 |
| JP | 2004271480 | 9/2004 |
| JP | 2005518970 | 6/2005 |
| JP | 2006275526 | 10/2006 |
| JP | 2007523776 | 8/2007 |
| JP | 2008247739 | 10/2008 |
| JP | 2009084143 | 4/2009 |
| JP | 2010037115 | 2/2010 |
| JP | 2011510904 | 4/2011 |
| JP | 2013520388 | 6/2013 |
| JP | 2013224964 | 10/2013 |
| JP | 2014055981 | 3/2014 |
| WO | 0137006 | 5/2001 |
| WO | 2009051595 | 4/2009 |
| WO | 2009071667 | 6/2009 |
| WO | 2010127845 | 11/2010 |
| WO | 2012163946 | 12/2012 |

OPTICAL ELEMENT WITH HIGH SCRATCH RESISTANCE

CROSS REFERENCE TO RELATED APPLICATIONS

This application is a continuation of US application Ser. No. 14/732,327 filed Jun. 5, 2015, which claims benefit under 35 USC § 119(a) of German Patent Application No. 10 2014 108 058.0 filed Jun. 6, 2014 the entire contents of which are incorporated herein by reference.

BACKGROUND

1. Field of the Disclosure

In general, the invention relates to optical elements, such as viewing panels or cover glasses for optical displays, for example, of mobile phones or watches, or for optical systems, such as, for example, objectives or optical measuring instruments. In particular, the invention relates to measures for improving the stability of the surface relative to scratching.

2. Description of Related Art

In order to protect surfaces of optical elements against scratching, it is known to provide the surface with a hard coating. Thus, a hard anti-reflection coating is known from EP 2492251 A1.

However, it has been determined by the present disclosure that there is a continuing need for coatings with improved scratch resistance. Thus, the object of the invention is now based on improving the scratch resistance of such coatings.

SUMMARY

Accordingly, the invention provides an optical element with high scratch resistance with a substrate that is transparent in the visible region of the spectrum, in particular, in at least a partial region of the wavelength region from 380 nanometers to 780 nanometers. A multilayer anti-reflection coating is deposited on the substrate, this coating having alternating layers of layers having a first refractive index and of layers having a second, higher refractive index, wherein the layers having the higher refractive index contain nitride or oxynitride and the layers having the first refractive index contain oxide of silicon and of at least one other element, wherein the molar fraction of silicon is predominant when compared with the molar fraction(s) of the other element or elements in the layers having the first refractive index, and wherein the uppermost layer of the multilayer anti-reflection coating is a layer having the first refractive index, and wherein a layer of chain-form organofluoro molecules is disposed on the uppermost layer, wherein the molecules are preferably bonded at their ends to the surface of the uppermost layer of the anti-reflection coating. Due to the bonding to the surface at their ends, the chains of the organofluoro coating are oriented away from the surface, or have a preferred orientation along the surface normal line.

In the sense of the invention, an optical element is scratch-resistant, if, after an abrasively acting stress of the coating, scratches are surprisingly small in comparison to the uncoated substrate, at least visually, or are not visible at all. The layers containing nitride or oxynitride are also preferably silicon-based like the layers having the first refractive index. In particular, the layers having the second refractive index, just like the layers having the first refractive index, can be doped with at least one other element. According to this embodiment, the layers having a higher refractive index contain nitride or oxynitride of silicon and of at least one other element.

It is likewise also possible, however, to form the layers having the second, higher refractive index from nitrides or oxynitrides of elements other than silicon. For example, layers containing nitrides or oxynitrides of titanium or chromium as the only component or as the principal component shall be named.

It will not be excluded that still other intermediate layers are also found between the alternating layers having the first and the second refractive indices. For example, doped silicon oxynitride layers could likewise be interposed between layers having the first and the second refractive indices, these layers containing silicon oxide or nitride, respectively, preferably containing silicon nitride, if this results in a favorable optical design.

Furthermore, gradients of layers, which vary in oxygen or nitrogen content, at least partially, are also to be understood as intermediate layers.

It is shown surprisingly that the organofluoro molecules still further considerably improve the scratch resistance of the already very hard anti-reflection coating based on the nitride layers. This is expressed by wear tests in a clearly extended period of time until there is a significant increase of light scattering and a change in the anti-reflection properties.

In particular, the layer of organofluoro molecules is particularly preferred to be very thin, i.e., monomolecular. This single-molecule layer is thus not active optically or is just barely active and is also correspondingly visually inconspicuous.

It is believed that the organofluoro layer, although it is not itself hard, reduces interaction with the surface. In particular, it also happens here that the uppermost oxide layer of the anti-reflection coating has a hardness that is less than that of the nitride layer following thereon based on the alternating sequence of layers. In this case, an effect is based on a reduction in the friction coefficient of the surface due to the organofluoro molecules.

The organofluoro layer prevents the formation of chemical bonds between the surface and an abrasive medium, as is produced during an effective abrasion. Thus, glass is readily polished with cerium oxide, since the latter compound forms covalent bonds with glass and thus clearly increases the material removed. Abrasion and polishing typically represent a physical-chemical process.

The coating of the optical element is thus able to resist scratching as long as the organofluoro molecules are bound to the surface. A stripping of the organofluoro molecules may occur, however, if, e.g., the surface is chemically attacked through the organofluoro layer or is attacked at sites where the organofluoro layer has broken down. The additional element present as an oxide in the uppermost layer comes to bear here. That is, the chemical resistance of the surface can be considerably improved by means of this at least one additional element and the durability of the organofluoro molecules can also be improved indirectly thereby.

According to a particularly preferred embodiment of the invention, the layer of organofluoro molecules is thus deposited directly onto the surface of the uppermost oxide layer of the anti-reflection coating. Optionally, however, yet another thin, optically inactive intermediate layer can also be provided, which serves as an adhesion promoter. Such an adhesion promoter preferably has a layer thickness of less than 10 nm, preferably less than 8 nm, more preferably of less than 6 nm, in order not to be optically active. A layer containing silicon oxide, particularly a mixed oxide layer with silicon oxide as the principal component, is suitable for such an adhesion promoter layer.

The hard anti-reflection coating with the layer of organofluoro molecules is particularly suitable also for hard substrates with high Knoop hardness and/or a high modulus of elasticity. In this case, a high Knoop hardness is also essentially retained after the coating, or it is improved even further. Accordingly, according to an embodiment of the invention, the Knoop hardness on the coated surface of the optical element amounts to at least 600 kilograms per square millimeter (600 kg/mm2). According to another embodiment, a substrate is selected that has a modulus of elasticity of at least 50 GPa. One of the preferred materials for the substrate is sapphire, or $Al_2O_3$.

BRIEF DESCRIPTION OF THE DRAWINGS

The invention will be explained more precisely in detail below, also with reference to the appended drawings.

DETAILED DESCRIPTION

Figure 1:
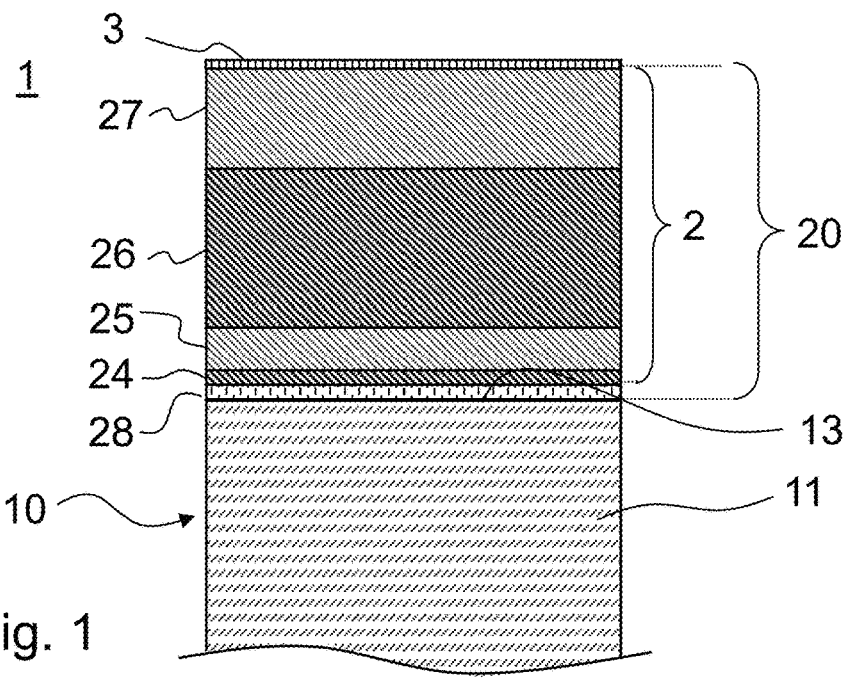
FIG. 1 shows a cross section through an optical element according to a first embodiment.
Figure 2:
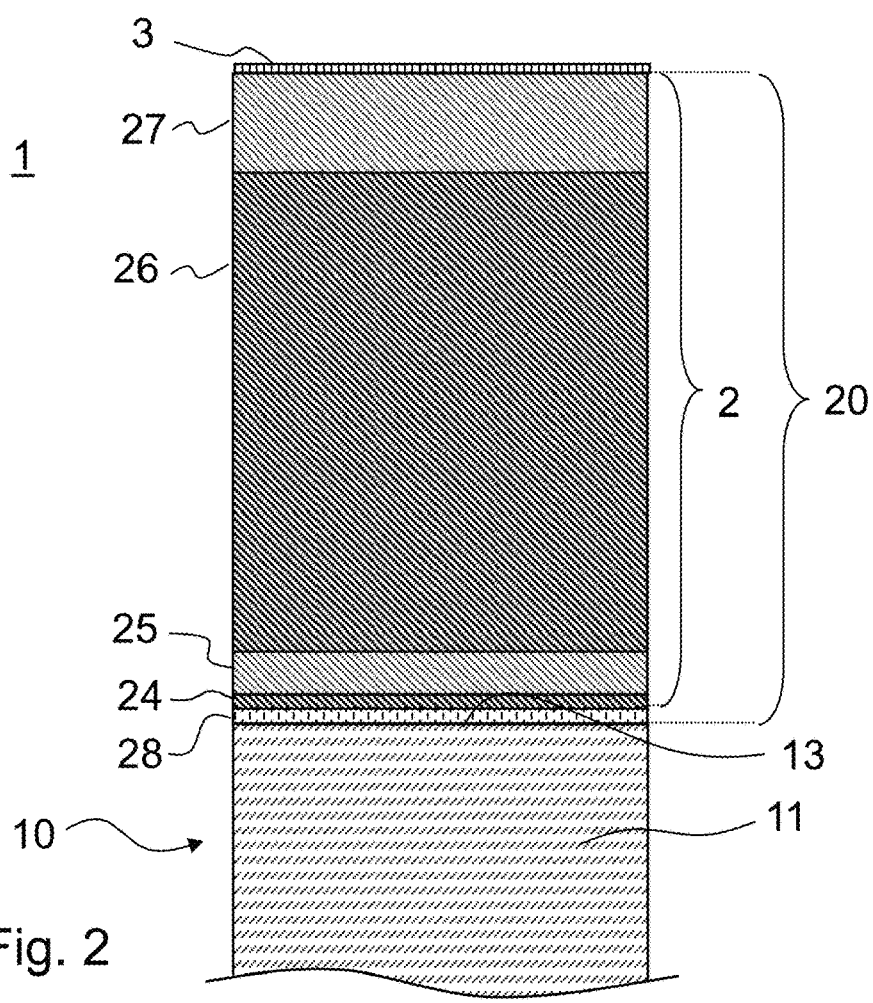
FIG. 2 shows a cross section through a variant of the example shown in FIG. 1.

FIG. 1 and FIG. 2 show examples of optical elements 1 according to the invention with high scratch resistance, having a transparent substrate 10 in the visible spectral region, and a multilayer anti-reflection coating 2 deposited on the substrate 10. Layers 25, 27 of the anti-reflection coating 2 having a first refractive index alternate with layers 24, 26 having a second, higher refractive index in comparison to the first refractive index.

A layer 3 of chain-form organofluoro molecules is disposed on the uppermost layer 27 of the anti-reflection coating, wherein the molecules are bonded at their ends to the surface of the uppermost layer 27 of the anti-reflection coating 2.

The organofluoro molecules preferably contain perfluorinated carbon chains, in which all hydrogen atoms, in particular, can also be replaced by fluorine atoms. In addition, the organofluoro molecules are preferably individually covalent at the surface of the optical element 1. The individual molecules can also enter into more than just one covalent bond with the surface.

Suitable for layer 3 without limitation to the special exemplary embodiments are, in particular, perfluoro ethers with terminal silane group, for example, the "Optool™ AES4-E" coating or the "Optool™ DSX" coating of Daikin Industries LTD., perfluoro ethers with two terminal silane groups, for example, the "Fluorolink S10" coating of Solvay Solexis; perfluoro alkyl silane, preferably with purely inorganic silicon oxide fraction.

Coating is preferably conducted via liquid coating by means of a coating fluid. Suitable for this purpose is, for example, roll-coating, spin-coating, dip-coating or spraying methods.

According to yet another embodiment of the invention, layer 3 is applied by a vacuum coating process, wherein the organofluoro molecules are vaporized in vacuum and are deposited on the surface of the substrate 10 coated with the anti-reflection coating 2. Suitable, for example, is "Duralon UltraTec" of Cotec GmbH, Karlstein, which is marketed in tablet form.

An adhesion promoter layer between layer 3 and the anti-reflection coating 2, as it is provided e.g., according to WO 2012/163946 A1, is not necessary, in order to obtain the improvement in the scratch resistance of the surface of an optical element 1 according to the invention.

The layers 24, 26 with higher refractive index essentially contain nitride or oxynitride, and the layers with the first refractive index contain oxide of silicon and of at least one other element. Silicon represents the principal fraction of the nitride or oxide elements present, however, in terms of quantity in any case, according to a preferred embodiment, so that the molar fraction of silicon in the layers is predominant when compared to the molar fraction(s) of the other element or elements. The ratio of the quantity of silicon to the quantity of the other element or elements in the individual layers of the anti-reflection coating preferably amounts to at least 5:1, preferably at least 8:1. In other words, at least five times, preferably at least eight times more silicon is contained in the anti-reflection coating 2, compared to the quantity of the at least one other element.

The at least one other element is preferably selected from the elements: aluminum, tin, magnesium, phosphorus, cerium, zirconium, titanium, barium, strontium, cesium, niobium, boron.

These elements form both oxides as well as nitrides and simultaneously improve the chemical resistance of the coating.

According to another embodiment, nitrides or oxynitrides of an element other than silicon are used as the principal component or, in fact, the only component for the layers having the second, higher refractive index. For example, one thinks of titanium nitride, boron nitride, aluminum nitride, and/or chromium nitride, or of oxynitrides of titanium, boron, aluminum, and/or chromium.

The improvement in the chemical stability of the coating according to the invention can be demonstrated, for example, by means of a salt water spray mist test, preferably according to DIN EN 1096-2:2001-05.

Vacuum deposition methods are particularly suitable for the production of the anti-reflection coating. Accordingly, in general, the invention provides, without limitation to the example shown, a method for producing an optical element 1 according to the invention, in which a substrate 10 that is transparent in the visible spectral region is prepared and a multilayer anti-reflection coating 2 is applied onto the substrate 10, in that alternating layers of a layer having a first refractive index and a layer having a second, higher refractive index are deposited by means of a vacuum deposition method, wherein the layers having the higher refractive index contain nitride or oxynitride and the layers having the first refractive index contain oxide of silicon and of at least one other element, and wherein the molar fraction of silicon is predominant when compared with the molar fraction(s) of the other element or elements in the layers with the first refractive index, and wherein the uppermost layer of the multilayer anti-reflection coating is a layer having the first refractive index, and wherein a coating with a layer 3 of chain-form organofluoro molecules is applied on the anti-reflection coating, wherein the molecules are bound on their ends to the surface of the optical element, most preferably to the uppermost layer 27 of the anti-reflection coating 2.

In addition, it is preferred that the layers 24, 25, 26, 27 of the anti-reflection coating 2 are deposited by reactive magnetron sputtering. A silicon sputtering target, which is doped with at least one other element, can be used for this purpose. Aluminum, preferably with a content of at most 20 mol % in the target is particularly preferred as the at least one other element. The layers of the anti-reflection coating 2, which are produced by means of such a target, are thus oxide layers having the first refractive index and nitride layers of silicon and aluminum having the second refractive index, the quantity ratio of silicon to aluminum amounting to at least 5:1. Instead of aluminum, however, the other named elements may also be present, or, in addition to aluminum, at least one other of the named elements may be present.

As an alternative to the deposition by reactive magnetron sputtering, ion-beam sputtering can also be used in order to apply the layers of the anti-reflection coating.

According to a particularly preferred embodiment, on which the exemplary embodiments of FIG. 1 and FIG. 2 are also based, an anti-reflection coating 2 with a multilayer stack is deposited onto the substrate 1, this layer stack being comprised of four successive layers 24, 25, 26, 27. The lowermost layer 24 is a higher refracting layer containing silicon nitride, wherein the other higher refracting layer 26 containing silicon nitride, which forms the uppermost high-refracting layer of the layer stack, has the greatest layer thickness within the layer stack, and wherein the uppermost layer 27 of the layer stack forms a layer having the lower refractive index and is composed of silicon oxide, preferably with a fraction of aluminum, and has the second-greatest layer thickness among the layers of the layer stack; wherein the first layer 24, plus the second layer 25, which, like the uppermost layer 27, is a layer having the lower refractive index and is composed of silicon oxide with a fraction of aluminum, together have a layer thickness that is thinner than the layer thickness of the uppermost layer.

In particular, in the example shown in FIG. 2, the uppermost high-refracting layer of the likewise four-layer anti-reflection coating is very thick. The example shown in FIG. 2 is optimized for a very high scratch resistance. The anti-reflection properties, however, are surprisingly only slightly poorer than in the example optimized for low reflectance that is shown in FIG. 1.

The coating of the surface 13 of the substrate 10 may also comprise other layers in additional to the anti-reflection coating 2. According to one embodiment, it is generally provided for this purpose, without limitation to the examples shown in the figures, that a layer 28 that Contains silicon oxide and serves as an adhesion promoter for the subsequently deposited anti-reflection coating 2 is deposited on the surface 13 of the substrate 10. The layer 28, together with the anti-reflection coating 2, forms an inorganic coating 20. A thin silicon oxide layer, particularly a layer with a composition like the low-refracting layers 25, 27 of the anti-reflection coating 2 have, is suitable, for example, for the layer 28.

Such an adhesion promoter layer in the form of a layer 28 composed of silicon oxide is particularly suitable for coupling the hard anti-reflection coating with hard substrates. Such a coating is particularly suitable for a substrate 10 composed of sapphire or $Al_2O_3$. According to one embodiment of the invention, an optical element 1 is provided in the form of a watch glass with sapphire substrate 10 and the coating according to the invention. The coating makes it possible to obtain the scratch resistance of uncoated sapphire, or to at least come close to this, but simultaneously to also improve the optical properties with respect to reflectance. Sapphire has a high refractive index of more than 1.7, so that sapphire glasses are intensely reflective. This disadvantage will be avoided with the anti-reflection coating.

The relative thicknesses of the layers, which were explained above for the exemplary embodiment of FIG. 1, are also fulfilled in the example shown in FIG. 2 and preferably also apply to the embodiment having a very thick uppermost layer 26 having the high refractive index, which is explained below.

In the variant of FIG. 2, the uppermost layer containing silicon nitride, or the uppermost layer 26 having the second refractive index is clearly thicker than in the example shown in FIG. 1. In general, without limitation to the special example shown, according to one embodiment of the invention, it is provided for this purpose that the anti-reflection coating 2 comprises a layer stack of four successive layers 24, 25, 26, 27 with two layers 24, 26 having the second, higher refractive index, in which the upper 26 of these two layers having the second, higher refractive index has a layer thickness that amounts to at least 40% of the thickness of the anti-reflection coating 2, preferably at least 60% of the thickness of the anti-reflection coating 2, more preferably at least 70% of the thickness of the anti-reflection coating 2.

In the example shown in FIG. 2, the thickness of the layer 26 in fact amounts to more than 70% of the layer thickness of the anti-reflection coating 2.

According to yet another embodiment of the invention, it is provided that the anti-reflection coating 2 comprises a layer stack, in which the uppermost layer 26 having the second refractive index has the greatest layer thickness of all the layers of the anti-reflection coating and has a layer thickness in the range of 100 nm to 700 nm, preferably of 300 nm to 600 nm, more preferably of 400 nm to 500 nm. This embodiment of the invention preferably also relates to the examples shown in FIGS. 1 and 2, but can also be applied to other anti-reflection coatings with more or fewer layers. The thickness of the upper nitride hard-material layer provides for a high resistance capability.

In order to test and to compare the scratch resistance of the optical elements according to the invention, an abrasion test can be conducted. The test used for the investigations is a modified Bayer test according to ASTM F735-11. In this case, the optical elements to be tested are covered with a granular, abrasive medium in a tub, and the tub is set to oscillate. Aluminum oxide sand with a grain size between 297 μm and 420 μm and a Mohs hardness of 9 was used as the abrasive medium. The bath was filled with an amount of 2 kg of sand, so that a sand layer of approximately 18 mm thickness results. The bath oscillates at 150 cycles per minute.

Figure 3:
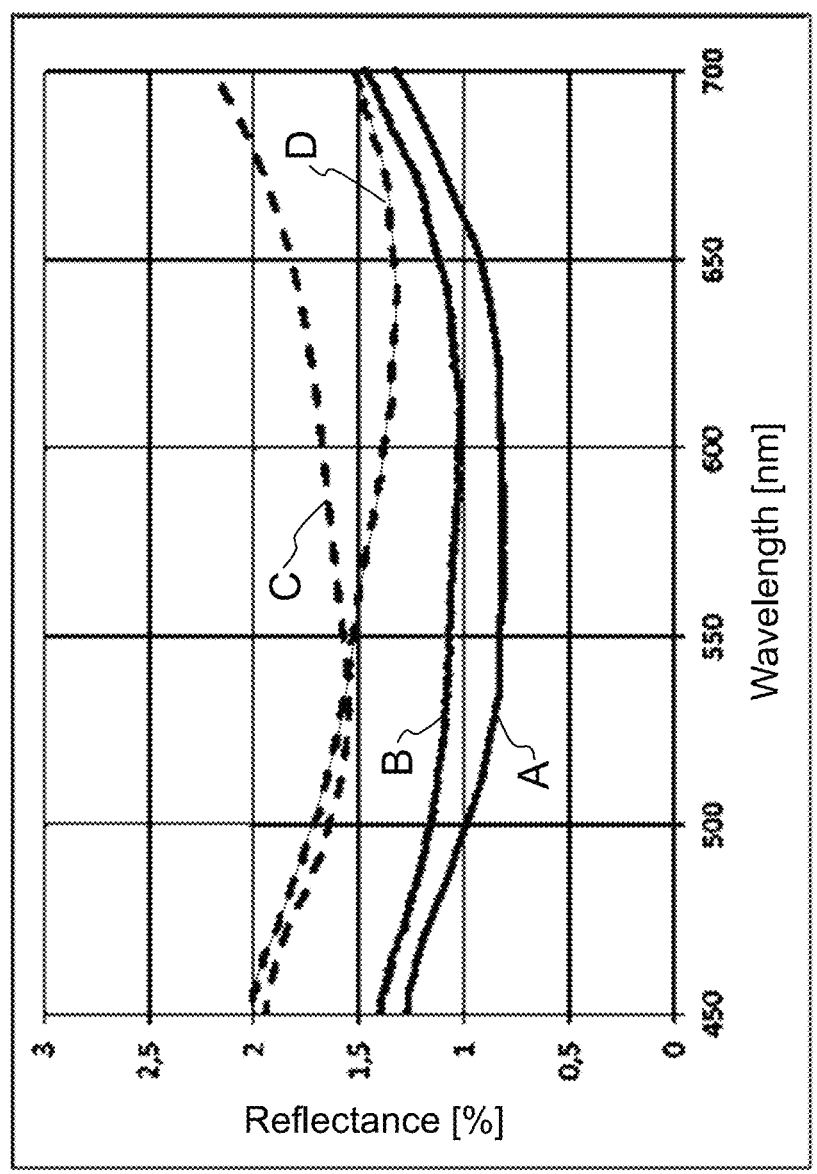
FIG. 3 shows plots of the spectral reflectance measured on two samples before and after an abrasion test.

FIG. 3 shows the spectral reflectance of two optical elements in the visible spectral region between 450 nm and 700 nm, each measured before and after an abrasion test as described above, with 8000 cycles.

Curve "A" is the reflectance of a sapphire substrate coated with a four-layer anti-reflection coating; curve "C" is the reflectance of this sample after the abrasion test.

Curve "B" shows the spectral reflectance of an optical element according to the invention with a sapphire substrate, in which the anti-reflection coating 2 was coated additionally with a layer of organofluoro molecules 3. Finally, curve "D" shows the reflectance of this sample after the abrasion test. As can be seen from the curves, the spectral reflectance changes less after the abrasion test in the case of the optical element according to the invention (i.e., from curve "B" to curve "D") than it does in the case of the anti-reflection coating without organofluoro coating (curves "A" and "C"). The difference between the curves "A" and "B" lies both in fluctuations in process parameters during coating as well as in the presence of the organofluoro coating.

The effect of the mechanical stability or the effectiveness with respect to the scratch sensitivity of the coated optical elements according to the invention can also be conducted with a sandpaper test. The effect of the layer system according to the invention will be explained in the following on the basis of chemically prestressed glass elements. In this case, the effect of sand grains on the glass elements is simulated.

Measurements were conducted of the per cent increase in the haze value as a consequence of the sandpaper test on anti-reflection coatings as shown in FIG. 1 and FIG. 2. Here, a chemically prestressed aluminosilicate glass serves as the transparent substrate 10.

The haze measurement is conducted according to the ASTM Standard D1003-95. In this case, the fraction of scattered light in the light transmitted by the glass element is compared with the intensity of the total transmitted light.

The scattering is thus a measure for the fraction of the surface damaged by scratches. A defect in the surface of the glass leads to a deflection of the beam striking perpendicular to the glass surface and is deflected from its direction of incidence. The greater the damage is to the surface, the more the light is deflected away from the detector. Thus, the haze value, given in per cent, is a measure for the degree of damage to the surface.

Figure 4:
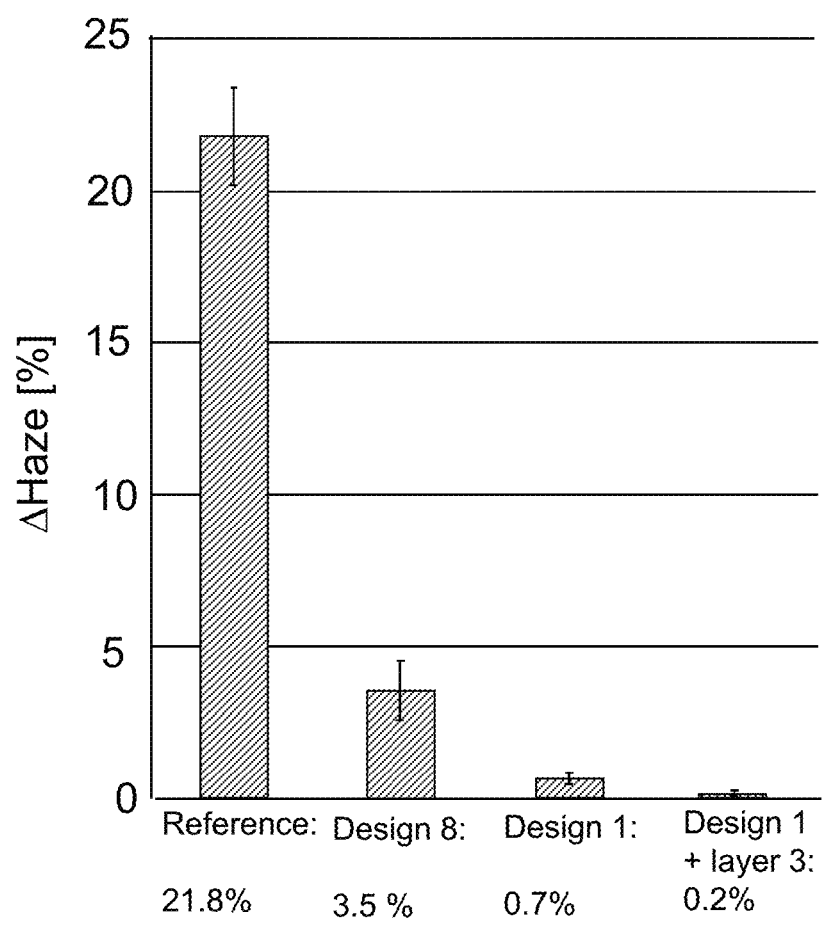
FIG. 4 shows bar graphs for the percent increase in the haze value after a sandpaper test for an uncoated, chemically prestressed glass substrate and for three different coated, chemically prestressed glass substrates.

The results of the haze measurements are shown in FIG. 4 as bar graphs. The measurement values in FIG. 4 thus represent the per cent increase in the fraction of scattered light due to scratches and other damage to the substrate surface after the sandpaper test. The sample named "Design 8" has a four-layer structure similar to the example of FIG. 1. In the case of the sample named "Design 1", the layer structure corresponds to the four-layer structure according to FIG. 2 in which the upper layer 26 having the second refractive index has a layer thickness that constitutes more than 70% of the total layer thickness of the anti-reflection coating 2.

The change in the haze value after the sandpaper test shows that the coating of the glass substrate with the layer system according to Design 1, which is optimized for scratch resistance with a particularly thick layer for the upper nitride hard-material layer of the anti-reflection coating 2, shows a surprisingly clear improvement when compared to the uncoated glass substrate, but also when compared to the layer system of Design 8 (according to FIG. 1), whose upper layer 26 having the second refractive index of the anti-reflection coating 2 is less than one-third as thick as the one according to Design 1.

In addition, it has been shown surprisingly that a layer system according to the invention, in which a layer 3 of organofluoro molecules is additionally introduced, considerably improves the prevention of scratches. As can be seen from FIG. 4, the measured increase in the haze value is reduced once more by a factor of three when compared to the hard anti-reflection coating without layer 3, and amounts to only 0.2%. In contrast to this, the increase in the haze value in the case of the uncoated, chemically prestressed aluminosilicate glass reference sample at 21.8% is greater by a factor of more than 100.

Figure 5:
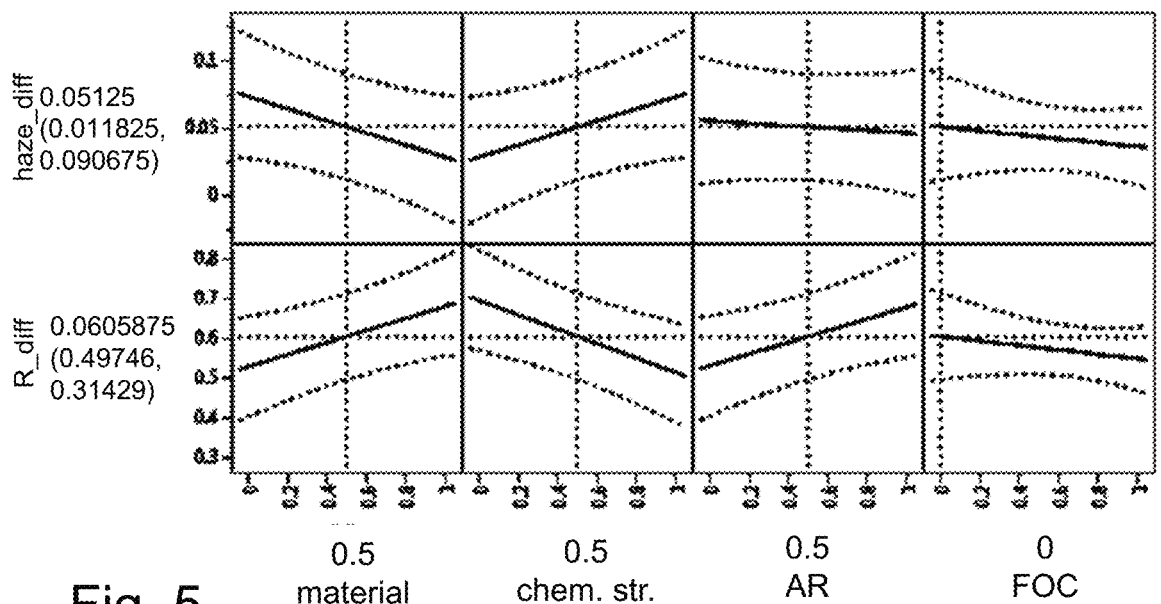
FIG. 5 shows a diagram for the increase in the haze value and the reflectance dependent on different influence factors.
Figure 6:
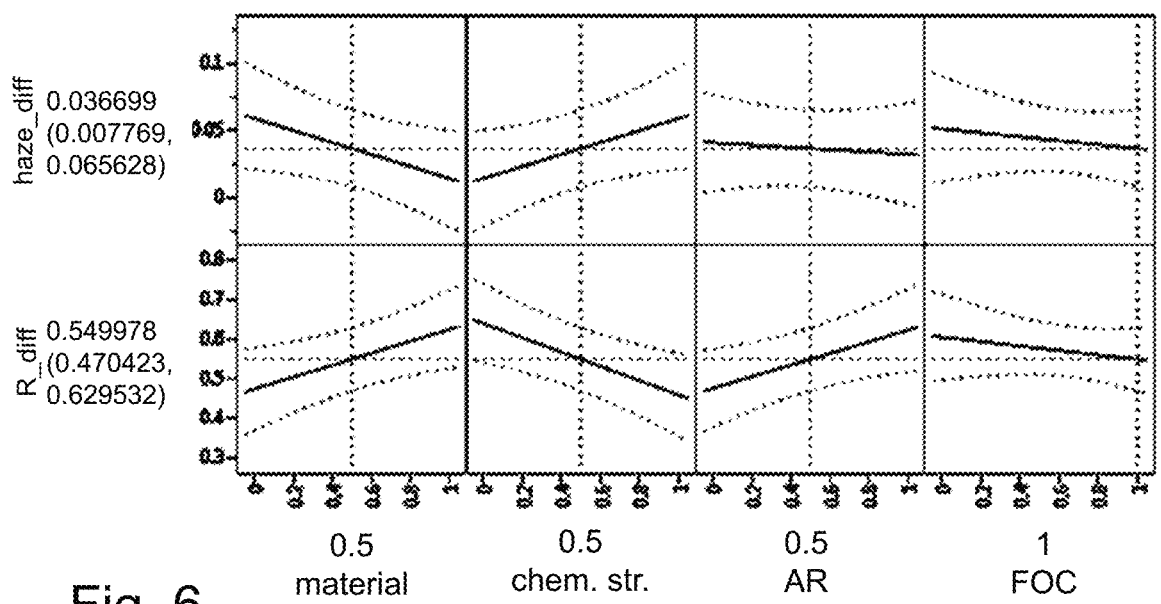
FIG. 6 shows a diagram for the increase in the haze value and the reflectance dependent on different influence factors.

In the following, it will be explained on the basis of FIG. 5 and FIG. 6 which effects individual influence factors have on the scratch resistance. FIG. 5 and FIG. 6 show diagrams of the increase in the haze value (named "haze_diff") and of the increase in reflectance (named "R_diff") due to an abrasion test (modified Bayer test with 8000 abrasion cycles) as a function of the different influence factors. The diagrams were created by comparison of a plurality of samples, each with a different material for substrate 10, with and without anti-reflection coating 2, with and without chemical prestressing, as well as with and without layer 3 of organofluoro molecules.

In this way, the effects of the individual influence factors can be isolated. In FIG. 5 each of these influence factors is evaluated on optical elements without layer 3; in FIG. 6, with an applied layer 3. Here, the scale on the abscissa indicates for which fraction the influence factor is present. Each time, four diagrams are presented next to one another; from left to right, the influence factors are: substrate material (diagrams designated "material"), chemical prestressing (diagrams designated "chem.str", anti-reflection coating 2 (diagrams designated "AR" and organofluoro layer 3 (diagrams designated "FOC". Here, except for the "material" diagrams, the value "0" represents the absence of the influence factor and the value "1" represents its presence. In the "material" diagrams, the value "0" denotes a borosilicate float glass and the value "1" denotes an aluminosilicate glass. Reflectance involves the average value in the wavelength region from 380 to 780 nm.

With the organofluoro coating, the reflectance increases on average by 0.55% in the abrasion test. Without the organofluoro coating, this increase due to abrasion is 0.61%. That is, the increase in reflectance caused by abrasion is reduced by 10% due to the organofluoro layer 3.

With the organofluoro coating, the haze (the light scattering) increases on average by 0.037% in the abrasion test. Without a layer 3, this increase amounts to 0.051% due to abrasion. This means that the increase in haze caused by abrasion is reduced by 27% due to layer 3.

In an evaluation, if all samples are considered independently from other parameters, one does not observe a comparison relative to the influence strength of the other parameters, but only the influence of the organofluoro layer, and one arrives at the following values: With the organofluoro layer 3, the reflectance of all samples increases on average by 0.527% in the abrasion test. Without the organofluoro coating, this increase due to abrasion is 0.565%. That is, the increase in reflectance caused by abrasion is reduced by 7% due to the organofluoro coating. With the organofluoro coating, the haze (the light scattering) increases on average by 0.025% on all samples in the harsh abrasion test. Without the organofluoro layer 3, this increase due to abrasion is 0.041%. That is, the increase in haze caused by abrasion is reduced by 38% due to the organofluoro layer 3.

Based on the diagrams (FIG. 5 and FIG. 6), it is observed that the influence on abrasion resistance (change in the reflectance or haze due to abrasion) depends greatly on the material, prestressing, and the anti-reflection coating. Nevertheless, the influence of the organofluoro layer 3 is clearly present.

Furthermore, it has been shown, however, that the combination of the organofluoro layer 3 with the anti-reflection coating 2 results in a clearly greater effect than the two influence factors by themselves. Thus, the effect in the case of the impact of a sandpaper test shown in FIG. 4 is essentially greater. The anti-reflection coating 2 alone brings about a reduction in the haze increase by a factor of 30. With layer 3, this effect is once more considerably increased and brings about a reduction by a factor of 100. The effect caused only by the organofluoro layer 3 according to FIGS. 5 and 6 (modified Bayer test with 8000 cycles) is essentially smaller, even if it is considered that the abrasion test of FIGS. 5 and 6 simulates clearly harsher conditions and the results therefore cannot be directly compared.

The fact that an interaction between layer 3 and the anti-reflection coating 2 according to the invention is present is also clear according to the following table:

|  | Haze increase with layer 3 | Haze increase without layer 3 | Improvement in the haze increase |
| --- | --- | --- | --- |
| Without AR | 0.04 | 0.07 | 43% |
| With AR | 0.06 | 0.3 | 80% |

The table shows the effect of layer 3 for a borosilicate float glass substrate 10 with and without anti-reflection coating 2 based on the per cent improvement in the increase of the haze value according to the abrasion test. A high per cent improvement in this case means that the increase in the haze value is low when compared to the sample prior to the abrasion test. Accordingly, layer 3 reduces the haze increase when compared to the uncoated substrate.

In contrast, however, if a combination of anti-reflection coating 2 and organofluoro layer 3 according to the invention are used, once again an essentially clearer improvement in the increase of light scattering (haze) is observed when compared to a specimen coated with anti-reflection coating 2, but without layer 3. The improvement in the increase of the haze value is, at 80%, almost twice as much as that for the uncoated sample. In the case of the increase in reflectance, the effect is in fact smaller (see FIG. 3), but still clear. Here, it should also be noted that in the case of an anti-reflection coating the reflectance is sensitive to a reduction in the layer thickness of the uppermost layer 27. If the layer thickness is reduced by abrasion, then this leads to a spectral shift of the interference effects. In contrast, in the case of an uncoated glass, the refractive index and along with it, the reflectance, does not change in the case of an abrasion. In this respect, the improvement obtained by layer 3 in the case of the anti-reflection coating, which is more sensitive relative to reflectance with abrasion, also shows a very clear effect.

The over-proportionally large effect for the improvement in the scratch resistance is attributed to an interaction between the doping of the uppermost layer 27 of the anti-reflection coating and the coating by means of the organofluoro molecules of layer 3. On the one hand, the chemical resistance is increased by the at least one other oxide in addition to silicon oxide. This oxide of another element possibly also has an influence on the covalent binding of the organofluoro molecules to the surface of the uppermost layer 27 of the anti-reflection coating.

Examples of optical elements 1 will be explained in the following.

Figure 7:
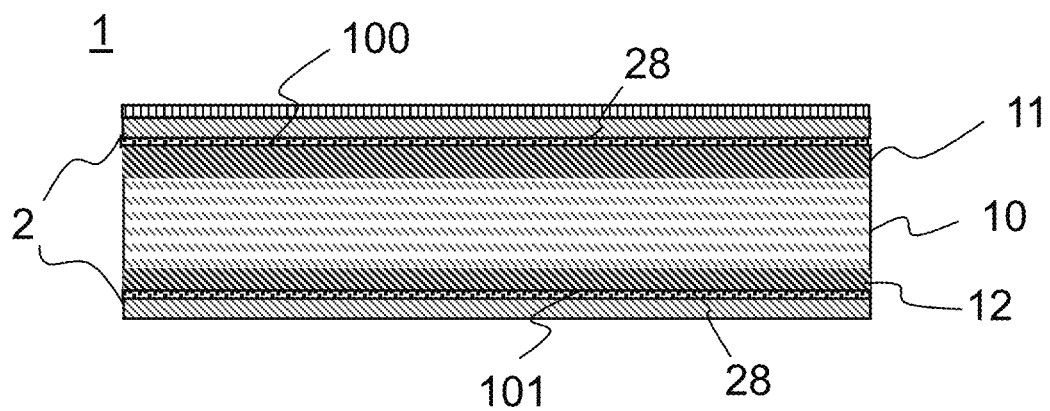
FIG. 7 shows an additional exemplary embodiment of an optical elements.

A preferred substrate 10 is a chemically prestressed glass, in particular in the form of a chemically prestressed glass panel. FIG. 7 shows such an example. On the surfaces 100, 101 of both sides, the panel-shaped substrate 10 has exchange layers 11, 12, which are placed under compressive stress by exchange of alkali ions of the glass by larger homologs (in particular, by an exchange of Na+ ions by K+ ions). The surfaces 100, 101 of the two sides form the surfaces that are provided with the anti-reflection coating 2. Alternatively, only one of the side surfaces 100, 101 may also be provided with an anti-reflection coating 2, depending on the targeted use.

Likewise, as in the case of the examples shown in FIGS. 1 and 2, it may also be favorable in the case of a chemically prestressed substrate 10 to deposit a layer 28 containing silicon oxide as an adhesion promoter for the subsequently deposited anti-reflection coating 2. This layer 28 preferably has the same composition as the layers of the anti-reflection coating 2 having the first refractive index.

The optical element 1 may be used, for example, as a closing element or window of the optics of a camera or of another optical sensor. The optical element may also be a cover glass for an optical display of a mobile electronic device, such as, for example, a smart phone, a tablet PC or a watch.

In addition, sapphire or $Al_2O_3$ can also be used as substrate 10 for such displays and can be provided with the coating according to the invention with anti-reflection coating 2 and organofluoro layer 3. Here also, as has already been mentioned above, preferably a layer 28 containing silicon oxide is used as adhesion promoter between sapphire surface and anti-reflection coating 2. The advantages are the same as in the embodiment of a sapphire watch glass, as explained above.

According to yet another embodiment of the invention, a substrate 10 composed of or containing zirconium oxide $ZrO_2$, is used. A $ZrO_2$ mixed crystal is used for such a substrate in order to stabilize a crystal phase, such as the cubic phase. In this case, for example, calcium oxide, magnesium oxide, or yttrium oxide is contained therein as stabilizer.

$ZrO_2$ has a high modulus of elasticity of approximately 200 GPa. In fact, the flexural rigidity is even higher than in the case of sapphire. In this respect, this material is also considered for applications in which a high substrate strength matters. Therefore, scratch resistances similar to sapphire are also obtained with the coating according to the invention. Disruptive reflections are also suppressed due to the very high refractive index of more than 2.

Additional possible substrates containing zirconium are hard materials such as zirconium carbide and zirconium nitride. Of course, these materials generally are not transparent or not very transparent. Yet another possible hard substrate material is silicon carbide, which is also used as a material in optics.

Figure 8:
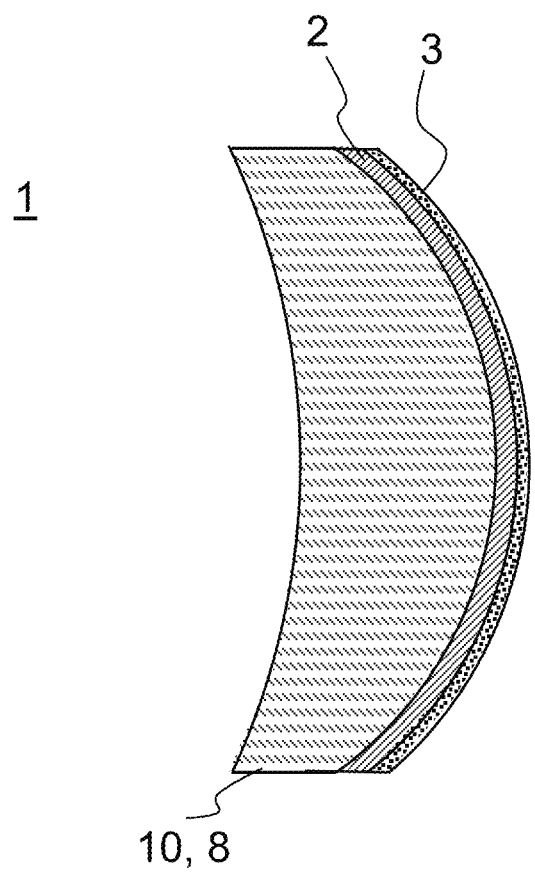
FIG. 8 shows an additional exemplary embodiment of an optical element.

Instead of a cover glass for optics, a lens may also be directly produced as optical element 1 with the coating according to the invention. FIG. 8 shows such an example. In the example shown, the substrate 10 in the form of a lens 8 is provided with the anti-reflection coating 2 and the organofluoro layer 3 applied thereon only on one side. This is useful, for example, if the lens 8 shall be cemented to another lens on the uncoated lens surface. Of course, here also, however, both lens surfaces may also be coated. For substrate 10, preferably optical glasses are used, such as, e.g., crown glasses or flint glasses or highly refractive glasses.

Advantageously, such lenses 8 with layer 3 pointing outward may form an objective or ocular lens of an objective, for example, for camera optics, for a microscope, or for a telescope.

What is claimed is:

1. An optical element with high scratch resistance, comprising:
    a substrate that is transparent in the visible spectral region;
    a multilayer anti-reflection coating on the substrate, the multilayer anti-reflection coating having alternating layers of a first layer type having a first refractive index and a second layer type having a second, higher refractive index, the second layer type comprising nitride or oxynitride, the first layer type comprising oxide of silicon and at least one other element, the first layer type having a ratio of silicon to the at least one other element of at least 5:1, wherein the multilayer anti-reflection coating has an uppermost layer that comprises the first layer type; and
    a layer of chain-form organofluoro molecules on the multilayer anti-reflection coating, the layer having molecules that are bonded at their ends to the uppermost layer of the multilayer anti-reflection coating
    wherein the optical element is configured for a use selected from the group consisting of a closing element, a window of optics of a camera, a sensor, and a cover glass for watches, objectives or optical measuring instruments.

2. The optical element according to claim 1, wherein the layer of chain-form organofluoro molecules is a monomolecular layer.

3. The optical element according to claim 1, wherein the layer of chain-form organofluoro molecules comprise molecules with perfluorinated carbon chains.

4. The optical element according to claim 1, wherein the at least one other element of the first layer type is an element selected from the group consisting of aluminum, tin, magnesium, phosphorus, cerium, zirconium, titanium, barium, strontium, niobium, and boron.

5. The optical element according to claim 1, wherein the substrate comprises a sapphire substrate.

6. The optical element according to claim 1, wherein the substrate comprises a chemically prestressed glass substrate.

7. The optical element according to claim 1, wherein the multilayer anti-reflection coating comprises a stack of four successive layers, the multilayer anti-reflection coating having a lowermost layer that comprises the second layer type, the uppermost layer having a second-greatest layer thickness among the stack, and wherein the lowermost layer and an adjacent layer of the first layer type together have a layer thickness that is thinner than a layer thickness of the uppermost layer.

8. The optical element according to claim 7, wherein the at least one other element of the layers of the first layer type comprises aluminum.

9. The optical element according to claim 1, wherein the multilayer anti-reflection coating has an upper layer of the second layer type that has a greatest layer thickness of the multilayer anti-reflection coating and has a layer thickness in the range of 100 nm to 700 nm.

10. The optical element according to claim 9, wherein the layer thickness is in the range of 400 nm to 500 nm.

11. The optical element according to claim 1, wherein the ratio of silicon to the at least one other element is at least 8:1.

12. The optical element according to claim 1, wherein the optical element has a Knoop hardness of at least 600 kilograms per square millimeter.

13. The optical element according to claim 1, wherein the substrate has a modulus of elasticity of at least 50 GPa.

14. The optical element according to claim 1, wherein the multilayer anti-reflection coating comprises a stack of four successive layers comprising two layers of the first layer type and two layers of the second layer type, an upper of the two layers of the second layer type having a layer thickness that amounts to at least 40% of a thickness of the multilayer anti-reflection coating.

15. The optical element according to claim 14, wherein the upper of the two layers of the second layer type has a layer thickness that amounts to at least 70% of the thickness.

16. A method for producing an optical element, comprising:
    preparing a substrate that is transparent in the visible spectral region;
    vacuum depositing a multilayer anti-reflection coating onto the substrate by alternating layers of a first layer type having a first refractive index and a second layer type having a second, higher refractive index, wherein the second layer type comprises nitride or oxynitride and the first layer type comprises oxide of silicon and at least one other element, wherein the first layer type has a ratio of silicon to the at least one other element of at least 5:1, and wherein the multilayer anti-reflection coating has an uppermost layer that comprises the first layer type; and
    applying a layer of chain-form organofluoro molecules on the multilayer anti-reflection coating so that molecules of the layer are bonded at their ends to the uppermost layer,
    wherein the layer and the multilayer anti-reflection coating reduce, when compared to the multilayer anti-reflection coating without the layer, an increase in haze-value after a modified Bayer test on a plurality of samples according to ASTM F735-11 with 8000 cycles; and
    wherein the optical element is configured for a use selected from the group consisting of a closing element, a window of optics of a camera, a sensor, and a cover glass for watches, objectives or optical measuring instruments.

17. The method according to claim 16, wherein the step of vacuum depositing comprises reactive magnetron sputtering.

18. The method according to claim 16, wherein the step of applying the layer comprises liquid coating.

19. The method according to claim 16, wherein the step of applying the layer comprises vaporizing in a vacuum deposition method.

20. An optical element with high scratch resistance, comprising:
    a substrate that is transparent in the visible spectral region;
    a multilayer anti-reflection coating comprising a first, uppermost layer of a first layer type, a second layer of a second layer type, a third layer of the first layer type, and a fourth, bottommost layer of the second layer type on the substrate, wherein the first layer type has a first refractive index and comprises oxide of silicon and at least one other element in a ratio of silicon to the at least one other element of at least 5:1, wherein the second layer type has a second, higher refractive index and comprises nitride or oxynitride, wherein the second layer has a layer thickness that is a greatest layer thickness within the multilayer anti-reflection coating and amounts to at least 40% of a thickness of the multilayer anti-reflection coating; and a layer of chain-form organofluoro molecules on the multilayer anti-reflection coating, the layer having molecules that are bonded at their ends to the uppermost layer, wherein the layer of chain-form organofluoro molecules and the multilayer anti-reflection coating reduce, when compared to the multilayer anti-reflection coating without the layer, an increase in haze-value after a modified Bayer test on a plurality of samples according to ASTM F735-11 with 8000 cycles; and wherein the optical element is configured for a use selected from the group consisting of a closing element, a window of optics of a camera, a sensor, and a cover glass for watches, objectives or optical measuring instruments.

21. The optical element according to claim 20, wherein the at least one other element of the first layer type comprises aluminum.

22. The optical element according to claim 20, wherein the layer thickness of the second layer amounts to at least 70% of the thickness of the multilayer anti-reflection coating.

23. An optical element with high scratch resistance, comprising:
a substrate that is transparent in the visible spectral region;
a multilayer anti-reflection coating comprising a first, uppermost layer of a first layer type, a second layer of a second layer type, a third layer of the first layer type, and a fourth, bottommost layer of the second layer type on the substrate, wherein the first layer type has a first refractive index and comprises oxide of silicon and at least one other element in a ratio of silicon to the at least one other element of at least 5:1, wherein the second layer type has a second, higher refractive index and comprises nitride or oxynitride, wherein the second layer has a layer thickness that is a greatest layer thickness within the multilayer anti-reflection coating and amounts to at least 40% of a thickness of the multilayer anti-reflection coating; and
a layer of chain-form organofluoro molecules on the multilayer anti-reflection coating, the layer having molecules that are bonded at their ends to the uppermost layer,
wherein the layer of chain-form organofluoro molecules and the multilayer anti-reflection coating reduce by 27% when compared to the multilayer anti-reflection coating without the layer of chain-form organofluoro molecules, an increase in haze-value after a modified Bayer test on a plurality of samples according to ASTM F735-11 with 8000 cycles.

* * * * *